United States Patent
Persechini (10) Patent No.: US 6,262,681 B1
(45) Date of Patent: Jul. 17, 2001

(54) METHOD AND APPARATUS FOR MICROWAVE SIGNAL GENERATION THAT USES POLARIZATION SELECTIVE PHOTONIC MIXING

(75) Inventor: David L. Persechini, Santa Monica, CA (US)

(73) Assignee: HRL Laboratories, LLC., Malibu, CA (US)

( * ) Notice: Subject to any disclaimer, the term of this patent is extended or adjusted under 35 U.S.C. 154(b) by 0 days.

(21) Appl. No.: 09/393,106

(22) Filed: Sep. 9, 1999

(51) Int. Cl.[7] .............................. G01S 13/88; G01S 13/00
(52) U.S. Cl. ............................ 342/188; 342/52; 342/54; 342/104; 342/165; 342/167; 342/361; 342/368
(58) Field of Search ................................ 359/142, 145, 359/154, 168, 173, 180, 188–195; 385/1–15, 39, 42, 88–94, 24; 372/9, 18, 19, 26, 27, 28; 331/184–187, 94.1; 342/52, 54, 104, 165, 169–175, 188, 361–377, 167

(56) References Cited

U.S. PATENT DOCUMENTS

| | | |
|---|---|---|
| 4,817,100 | 3/1989 | Cameron et al. . |
| 5,307,073 | 4/1994 | Riza . |
| 5,323,406 | * 6/1994 | Yee et al. ............................ 372/26 |
| 5,379,309 | * 1/1995 | Logan, Jr. ............................ 372/18 |
| 5,442,326 | 8/1995 | Liberman . |
| 5,687,261 | * 11/1997 | Logan ............................ 385/24 |
| 5,710,651 | * 1/1998 | Logan, Jr. ............................ 359/145 |

FOREIGN PATENT DOCUMENTS

| | | |
|---|---|---|
| 40 31 625 A1 | 4/1992 | (DE) . |
| 0 559 102 A1 | 9/1993 | (EP) . |

\* cited by examiner

Primary Examiner—Bernarr E. Gregory
(74) Attorney, Agent, or Firm—Ladas & Parry (57) ABSTRACT

A method and apparatus for generating microwave signal frequencies. An incident reference signal is provided. A first stimulus signal is also provided, the first stimulus signal having a first polarization and having a first predetermined relationship with the incident reference signal. A second stimulus signal is also provided, the second stimulus signal having a second polarization and having a second predetermined relationship with the incident reference signal. The incident reference signal is split into a first polarization reference signal and into a second polarization reference signal. The first stimulus signal is coupled with the first polarization reference signal to provide first polarization mixed signals. The second stimulus signal is coupled with the second polarization reference signal to provide second polarization mixed signals. The first polarization mixed signals are combined with the second polarization mixed signals to provide output signals having only a first component signal at the first predetermined relationship with the incident reference signal and a second component signal at the second predetermined relationship with the incident reference signal. The first predetermined relationship with the incident reference signal is provided by a first phase lock loop and the second predetermined relationship with the incident reference signal is provided by a second phase lock loop.

20 Claims, 3 Drawing Sheets

METHOD AND APPARATUS FOR MICROWAVE SIGNAL GENERATION THAT USES POLARIZATION SELECTIVE PHOTONIC MIXING

FIELD OF THE INVENTION

This invention relates to the field of microwave signal generation and, more particularly, to a method and apparatus for generating microwave frequency signals using polarization selective photonic mixing, such method and apparatus being useful for photodiode testing, for local oscillator distribution, or for phased array antenna systems.

BACKGROUND OF THE INVENTION

Microwave frequency signal processing is a common aspect of many modern electronic and/or optical systems. One such system is Doppler radar. If light of a single frequency is incident on a reflecting object that has some component of motion along the light's direction of travel, the frequency of the light will be changed by an amount related to the speed of the object. This is called the Doppler effect. The velocity of the object may be determined if the frequency of the reflected light is compared with that of the incident light. This comparison will be made automatically if the return light and the reference light fall on the receiver. The photocurrent produced will contain components related to the frequency difference that describes the velocity of the reflector, provided that the polarizations are parallel. If two reflectors with different velocities are present, two RF tones will be present in the stimulus. If the receiver is linear each reflector will be represented by a unique RF tone. Otherwise, other tones will be present. This is an important problem if these tones (distortion) are very close to those actually generated by the reflectors. Such tones will be created by 3rd order harmonic distortion. They are difficult to distinguish from those originating from actual reflectors and cannot be filtered out of the RF response since they are mixed in with genuine signal. This is illustrative of one motive to characterize the linearity of an optical receiver. A receiver's 3rd order distortion is often characterized in the laboratory using tones produced synthetically. Therefore, a need exists for an effective method and apparatus for signal generation that can be useful for the testing of photodiodes for intermodulation product distortion.

Two RF tones similar to those originating from moving reflectors may be produced from three optical frequencies if one of the three pairings can be eliminated. This is important since the third tone is not independent of the other two and will create problems in the Two Tone test of a receiver.

Further, many systems applications, such as in microwave signal generation and local oscillator distribution systems for space based radars and antenna systems, require the generation and delivery of very "clean" microwave signals, i.e., signals without unwanted harmonic mixing products and of narrow line width that is achieved via the phase locked loop.

The present invention provides a method and apparatus to meet such needs.

SUMMARY OF THE INVENTION

In accordance with the present invention a method and apparatus for generating microwave frequencies is provided.

In accordance with a first embodiment of the invention, an incident reference signal is provided. A first stimulus signal is also provided, the first stimulus signal having a first polarization and having a first predetermined relationship with the incident reference signal. A second stimulus signal is also provided, the second stimulus signal having a second polarization and having a second predetermined relationship with the incident reference signal. In accordance with the first embodiment of the present invention, the first polarization is horizontal and the second polarization is vertical. The incident reference signal is split into a first polarization reference signal and into a second polarization reference signal. The first stimulus signal is coupled with the first polarization reference signal to provide first polarization mixed signals. The second stimulus signal is coupled with the second polarization reference signal to provide second polarization mixed signals. The first polarization mixed signals are combined with the second polarization mixed signals to provide output signals only having a first component signal at the first predetermined relationship with the incident reference signal and a second component signal at the second predetermined relationship with the incident reference signal.

Further, in the first embodiment the first predetermined relationship with the incident reference signal is provided by a first phase lock loop and the second predetermined relationship with the incident reference signal is provided by a second phase lock loop. The first phase lock loop first couples a portion of the first stimulus signal and a portion of the first polarization reference signal to provide a first phase lock loop difference signal. The first phase lock loop difference signal is compared with a first predetermined difference reference signal to provide a first difference correction signal. The first stimulus signal is then tuned by the first difference correction signal to maintain the first predetermined relationship with the incident reference signal. Similarly, the second phase lock loop first couples a portion of the second stimulus signal and a portion of the second polarization reference signal to provide a second phase lock loop difference signal. The second phase lock loop difference signal is compared with a second predetermined difference reference signal to provide a second difference correction signal. The second stimulus signal is then tuned by the second difference correction signal to maintain the second predetermined relationship with the incident reference signal.

In accordance with a second embodiment of the present invention, an incident reference signal is provided. A first stimulus signal is also provided, the first stimulus signal having a first polarization and having a first predetermined relationship with the incident reference signal. A second stimulus signal is also provided, the second stimulus signal having a second polarization and having a second predetermined relationship with the incident reference signal. The first polarization is horizontal. The second polarization is vertical. The incident reference signal is split into a first reference signal and a second reference signal. However, the incident reference signal, the first reference signal, and the second reference signal are each at 45° polarization. The first stimulus signal is coupled with the first reference signal to provide first polarization mixed signals. The first polarization mixed signals are combined with the second stimulus signal to provide output signals only having a first component signal at the first predetermined relationship with the incident reference signal and a second component signal at the second predetermined relationship with the incident reference signal.

Further, in the second embodiment the first predetermined relationship with the incident reference signal is provided by a first phase lock loop and the second predetermined relationship with the incident reference signal is provided by a second phase lock loop. The first phase lock loop first couples a portion of the first stimulus signal and a portion of the first reference signal to provide a first phase lock loop difference signal. The first phase lock loop difference signal is compared with a first predetermined difference reference signal to provide a first difference correction signal. The first stimulus signal is then tuned by the first difference correction signal to maintain the first predetermined relationship with the incident reference signal. Similarly, the second phase lock loop first couples a portion of the second stimulus signal and a portion of the second reference signal to provide a second phase lock loop difference signal. The second phase lock loop difference signal is compared with a second predetermined difference reference signal to provide a second difference correction signal. The second stimulus signal is then tuned by the second difference correction signal to maintain the second predetermined relationship with the incident reference signal.

DETAILED DESCRIPTION

Figure 1:
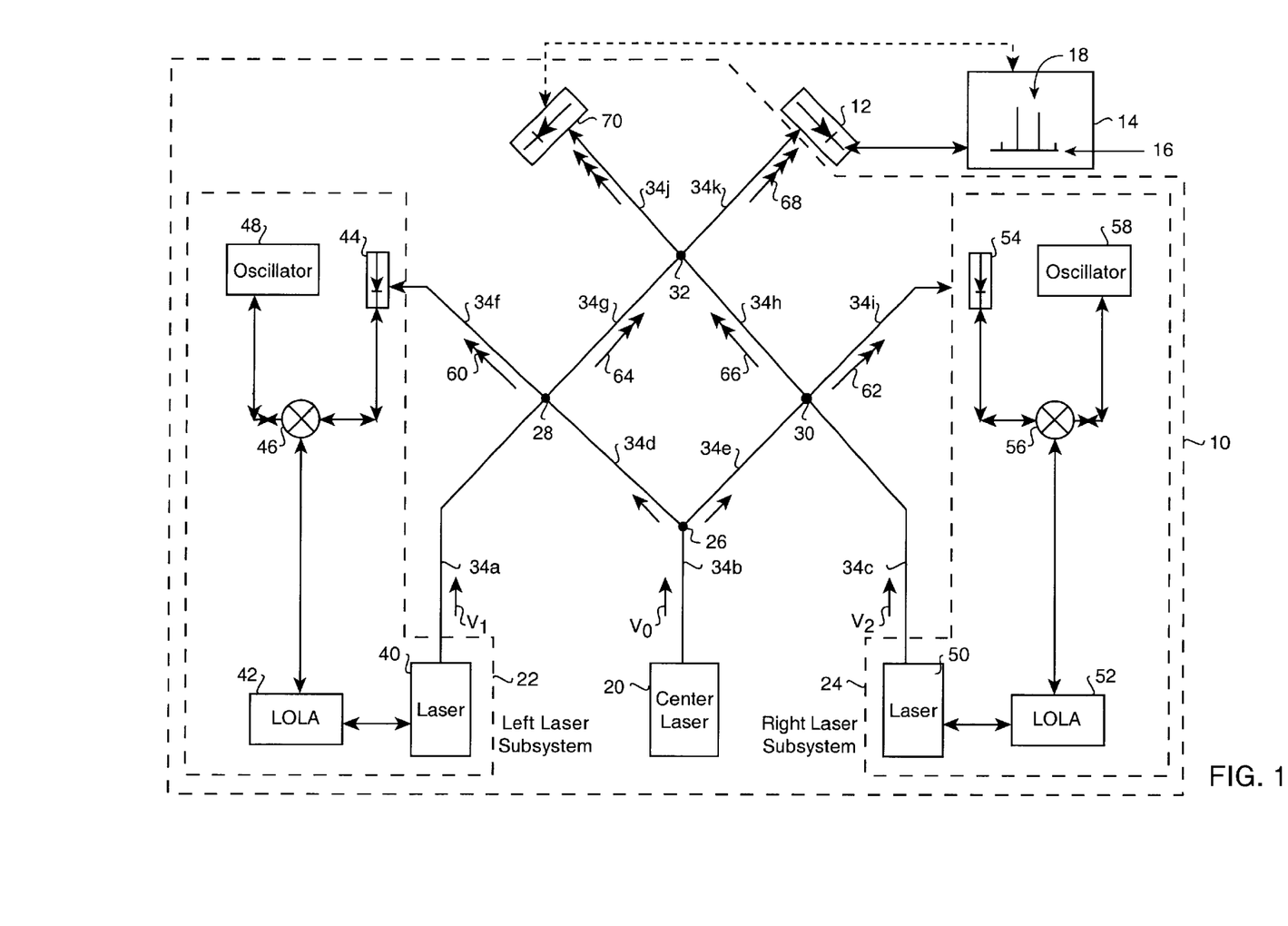
FIG. 1 shows a topological block diagram of one embodiment of the present invention.

Referring to FIG. 1, there is shown a topological block diagram of one embodiment of the present invention, wherein frequency generator 10 provides microwave frequencies for the testing of photodiode 12, typically using an RF Spectrum Analyzer 14, such as a Hewlett-Packard model 8565E. RF Spectrum Analyzer 14 measures (and displays, as required for testing purposes) the photocurrent produced by photodiode 12 when light (i.e., at microwave signal frequencies) is incident upon it. The photocurrent is related to the total power in the incident optical field. The goal of the measurement of photodiode 12 is to identify those diodes which have performance characteristics such that third order distortion signals 16 are below predetermined product characteristic specifications levels for such distortion with respect to electrical signal level representations 18 of the signals incident upon photodiode 12. Frequency generator 10 provides a system which processes three different microwave frequencies of light such that when mixed together in a certain relationship amongst themselves, they will interfere so that a desired input light (stimulus) is provided to the photodiode under test.

Frequency generator 10 includes center laser 20, left laser subsystem 22 and right laser subsystem 24. Nodes 26, 28, 30, 32 interconnect a polarization maintaining (PM) fiber optic network having fiber links 34a–34k for efficient light channeling. Center laser 20 is a tunable non-planar ring oscillator (NPRO) pigtail laser, for example, Lightwave Technology NPRO Laser product model No. 125-1319-xxx-w, having a wavelength of 1319 nm, and is coupled to PM fiber link 34b.

Figure 2:
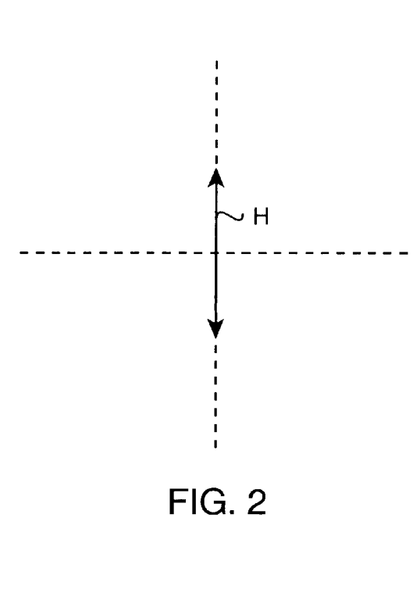
FIG. 2 shows a schematic representation of a vertical polarization of an microwave signal.
Figures 3, 4:
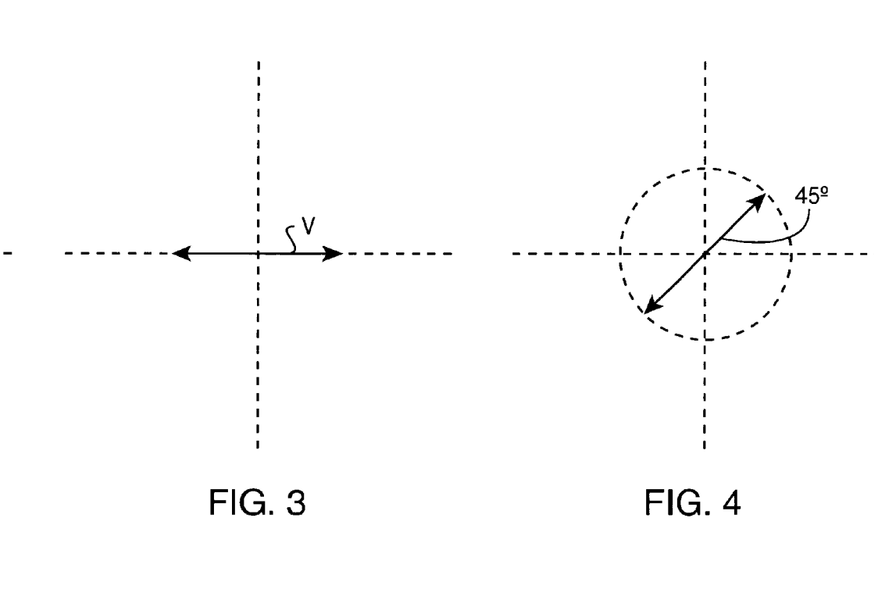
FIG. 3 shows a schematic representation of a horizontal polarization of an microwave signal.
FIG. 4 shows a schematic representation of a 45° polarization of an microwave signal.

Referring briefly to FIGS. 2, 3 and 4, there is depicted, respectively, vertical signal polarization V, horizontal signal polarization H, and a 45° signal polarization. When considering the endface of PM fiber links 34a–34k as seen in FIG. 1, a coordinate system for each endface can be established such that any polarization state that is launched into the fiber will be maintained with respect to the coordinate system. For example, referring back to FIG. 1, signal $v_0$ is launchable into PM fiber link 34b and has a vertical polarization.

Left laser subsystem 22 includes laser 40, whose characteristics are similar to that of center laser 20 but provides a different signal $v_1$, for example, one that is +10 GHz greater in frequency than $v_0$, which is launchable into PM fiber link 34a and also has a vertical polarization. However, to control the stability of the microwave frequency difference $v_0-v_1$, left laser subsystem 22 includes equipment which is used to make sure that frequency $v_1$ maintains a constant relationship to frequency $v_0$. In practicing the present invention, there is no particular concern if the frequency $v_0$ of center laser 20 varies slightly, but that the difference between $v_1$ and $v_0$ is maintained.

Referring back to center laser 20, laser light $v_0$ feeds into node 26, which is a coupler/splitter, for example, a Wave Optics PM 50:50 splitter product model no. 650/967-0700. At the splitter 50% of the $v_0$ power is diverted to PM fiber link 34d which outputs from coupler/splitter node 26 with a vertical polarization remaining. All of the $v_1$ NPRO laser 40 light and the 50% feed into line 34d from coupler splitter node 26 combine in a fiber optic coupler/splitter at node 28, a similar Wave Optics PM 50:50 splitter product to that of couple splitter node 26. Since the polarization states are the same, namely, both being vertically polarized, they mix. 50% of the output from coupler/splitter node 28, as indicated by mixing arrows 60, falls upon photodiode 44 in left laser subsystem 22 from PM fiber link 34f, where the difference frequency generated by photodiode 44 is fed into RF mixer 46. The RF mixer is such that it is compatible with the frequency range being measured, for example, Anaren RF mixer product model no. 73230. The difference frequency is compared with a reference frequency, i.e., the desired difference frequency, from very stable synthesized oscillator 48 set at the desired frequency and the desired frequency is compared with the frequency generated in photodiode 44. The output of RF mixer 46 is coupled to laser offset locking accessory (LOLA) 42, for example, Lightwave Technology product model No. LOLA 2000 or 2005. LOLA 42, which, in turn, is coupled to laser 40, allows for agile temperature tuning and for piezoelectric tuning of its coupled laser's frequency. As such, left subsystem 22 provides a phase lock loop, wherein the RF mixer produces the difference frequency between the reference and the actual difference frequency between the two light sources, lasers 20 and 40. If the difference frequency is non-zero, then a periodic function is output from the RF mixer and will cause a periodic variation in the frequency of $v_1$, which is being controlled by the LOLA 42. In essence, when the frequency difference between the reference and the actual frequency being generated is zero, but of the appropriate phase, then there is derived a steady-state voltage of the proper value so that the frequency of laser 40 is locked. It then follows that if small changes in the $v_0$ frequency from laser 20 are made, it will remain in lock. Therefore, $v_1$ is now controlled with respect to $v_0$ to obtain a desired difference frequency.

Similarly, right laser subsystem 24 includes laser 50, whose characteristics are similar to that of center laser 20 but provides a different signal $v_2$, for example, one that is +9 GHz greater in frequency than $v_0$, which is launchable into PM fiber link 34c and has a horizontal polarization. However, to control the stability of the frequencies $v_0$ and $v_2$, right laser subsystem 24 similarly includes equipment which is used to make sure that frequency $v_2$ maintains a constant relationship to the frequency $v_0$. As discussed similarly above with regard to $v_1$ and $v_0$, in practicing the present invention, there is no particular concern if the frequency $v_0$ of center laser 20 varies slightly, but that the difference between $v_2$ and $v_0$ is maintained.

Referring again back to center laser 20, laser light $v_0$ feeds into coupler/splitter node 26. At the splitter the other 50% of the $v_0$ power is diverted to PM fiber link 34e which outputs from coupler/splitter node 26 with a horizontal polarization. At coupler/splitter node 26 the left side output onto PM fiber link 34d is one polarization, namely vertical, while the right side output polarization onto PM fiber link 34e is orthogonal. This is achieved by having a linear polarization in the incident PM fiber link 34b to node 26. Because the polarization maintains a fixed relationship to the established coordinate system, a simple 90° rotation can provide the orthogonal polarization. Alternatively, light is not rotated 90° but launched at a 45° polarization, as is depicted in FIG. 4. All of the $v_2$ NPRO laser 50 light and the 50% feed into line 34e from coupler splitter node 26 combine in a fiber optic coupler/splitter at node 30, a similar Wave Optics PM 50:50 splitter product. to that of coupler/splitter node 28. Since the polarization states travelling along fiber links 34e and 34c are the same, namely, both being horizontally polarized, they likewise mix. 50% of the output from coupler/splitter node 30, as indicated by mixing arrows 62, falls upon photodiode 54 in right laser subsystem 24 from PM fiber link 34i, where the difference frequency generated by photodiode 54 is fed into an RF mixer 56. The RF mixer is such that it is compatible with the frequency range being measured, for example, as in left subsystem 22, Anaren RF mixer product model no. 73230. The difference frequency is compared with a reference frequency, i.e., the desired difference frequency, from very stable synthesized oscillator 58 set at the desired frequency and the desired frequency is compared with the frequency generated in photodiode 54 . The output of RF mixer 56 is coupled to laser offset locking accessory (LOLA) 52, for example, as in left subsystem 22, Lightwave Technology product model No. LOLA 2000 or 2005. LOLA 52, which, in turn, is coupled to laser 50, allows for agile temperature tuning and for piezoelectric tuning of its coupled laser's frequency. As such, right subsystem 24 likewise provides a phase lock loop, wherein the RF mixer produces the difference frequency between the reference and the actual difference frequency between the two light sources, lasers 20 and 50. If the difference frequency is non-zero, then a time varying function is output from the RF mixer and will cause a time varying variation in the frequency of $v_2$, which is being controlled by the LOLA 52. In essence, when the frequency difference between the reference and the actual frequency being generated is zero, but of the appropriate phase, then there is derived a steady-state voltage of the proper value so that the frequency of laser 50 is locked. It then follows that if small changes in the $v_0$ frequency from laser 20 are made, it will remain in lock. Therefore, $v_2$ is now controlled with respect to $v_0$ to obtain a desired difference frequency.

Referring back to coupler/splitter node 28, the remaining 50% of the optical power mix of $v_0$ and $v_1$, vertically polarized, flows through PM fiber link 34g, as indicated by mixing arrows 64, and is input into coupler/splitter node 32, also a Wave Optics PM 50:50 splitter product. Similarly, referring back to coupler/splitter node 30, the remaining 50% of the optical power mix of $v_0$ and $v_2$, horizontally polarized, flows through PM fiber line 34h, as indicated by mixing arrows 66, and is likewise input into coupler/splitter node 32. At coupler/splitter node 32 there is another coupler/splitter, much like that of coupler/splitter nodes 28 and 30, but not necessarily equal at this point. The splitting ratio at coupler/splitter node 32 is kept equal if it is desired to combine equal amounts of the light coming from node 28 and node 30. But such is not always needed.

At the right hand port of coupler/splitter node 32 there is output some $v_2$ (horizontal polarization), some $v_0$ (both horizontal and vertical polarization), and some $v_1$ (vertical polarization). Some $v_0$ polarization will mix with $v_1$ and some $v_0$ polarization will mix with $v_2$. On the other hand, $v_1$ and $v_2$ will not mix. The $v_0$ mixing with $v_1$ and the $v_0$ mixing with $v_2$ are represented by mixing direction arrows 68 and represent the stimulus light projected onto photodiode 12 under test. An optional portion of output from coupler/splitter node 32 along fiber link 34j can be monitored as desired by a reference photodiode 70, which, in turn, can be switched to for test comparison references measurements by RF Spectrum Analyzer 14.

Figure 5:
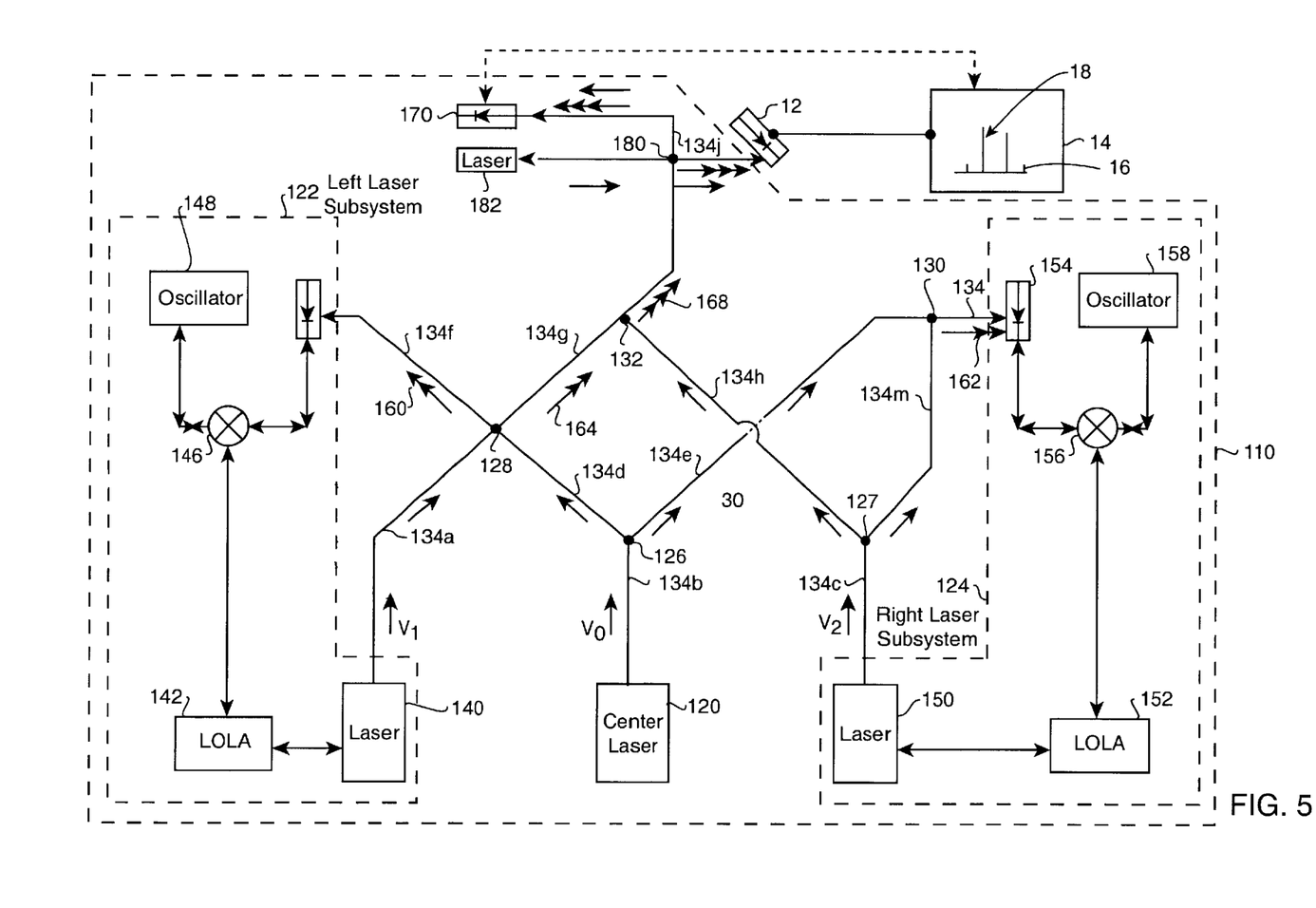
FIG. 5. shows a topological block diagram of a second embodiment of the present invention.

Referring to FIG. 5, there is shown another embodiment of the present invention in topological block diagram form. Frequency generator 110 provides microwave frequencies for the testing of photodiode 12, typically using an RF Spectrum Analyzer 14. As in the embodiment shown in FIG. 1, RF Spectrum Analyzer 14 measures (and displays, as required for testing purposes) the photocurrent produced by photodiode 12 when light (i.e., microwave signal frequencies) is incident upon it. The photocurrent is related to the total power in the incident optical field. Frequency generator 110 similarly provides a system which processes three different microwave frequencies of light such that when mixed together in a certain relationship amongst themselves, they will interfere so that a desired input light (stimulus) is provided to the photodiode under test.

Frequency generator 110 includes center laser 120, left laser subsystem 122 and right laser subsystem 124. Nodes 126, 128, 130, 132 interconnect a polarization maintaining (PM) fiber optic network having fiber links 134a–134k for efficient light channeling. Center laser 120 is a tunable non-planar ring oscillator (NPRO) pigtail laser, for example, Lightwave Technology NPRO Laser product model No. 125-1319-xxx-w, having a wavelength of 1319 nm, and is coupled to PM fiber link 134b.

Left laser subsystem 122 includes laser 140, whose characteristics are similar to that of center laser 120 but provides a different signal $v_1$, for example, one that is +10 GHz greater in frequency than $v_0$, which is launchable into PM fiber link 134a and also has a vertical polarization. However, to control the stability of the frequencies vo and $v_1$, left laser subsystem 122 also includes equipment which is used to make sure that frequency $v_1$ maintains a constant relationship to frequency $v_0$. Similar to that of the embodiment shown in FIG. 1, in practicing the present invention, there is no particular concern if the frequency vo of center laser 120 varies slightly, but that the difference between $v_1$ and $v_0$ is maintained.

Referring back to center laser 120, laser light $v_0$ at a 45° polarization feeds into node 126, which is a coupler/splitter, for example, a Wave Optics PM 90:10 splitter product model no. WX-902-352-73C4. At the splitter 90% of the $v_0$ power is diverted to PM fiber link 134d which outputs from coupler/splitter node 126 with a 45° polarization remaining. All of the $v_1$ NPRO laser 140 light and the 90% feed into line 134d from coupler splitter node 126 combine in a fiber optic coupler/splitter at node 128, a Wave Optics PM 50:50 splitter product. Since the polarization states are both vertical and 45°, they partially mix. 50% of the output from coupler/splitter node 128, as indicated by mixing arrows 160, falls upon photodiode 144 in left laser subsystem 122 from PM fiber link 134f, where the difference frequency generated by photodiode 144 is fed into RF mixer 146. The RF mixer is such that it is compatible with the frequency range being measured, for example, Anaren RF mixer product model no. 73230. The difference frequency is compared with a reference frequency, i.e., the desired difference frequency, from very stable synthesized oscillator 148 set at the desired frequency and the desired frequency is compared with the frequency generated in photodiode 144. The output of RF mixer 146 is coupled to laser offset locking accessory (LOLA) 142, for example, Lightwave Technology product model No. LOLA 2000 or 2005. LOLA 142, which, in turn, is coupled to laser 140, allows for agile temperature tuning and for piezoelectric tuning of its coupled laser's frequency. As such, left subsystem 122 provides a phase lock loop, wherein the RF mixer produces the difference frequency between the reference and the actual difference frequency between the two light sources, lasers 120 and 140. If the difference frequency is non-zero, then a time varying function is output from the RF mixer and will cause a time varying variation in the frequency of $v_1$ which is being controlled by the LOLA 142. In essence, as with the embodiment shown in FIG. 1, when the frequency difference between the reference and the actual frequency being generated is zero, but of the appropriate phase, then there is derived a steady-state voltage of the proper value so that the frequency of laser 140 is locked. It then follows that if small changes in the $v_0$ frequency from laser 120 are made, it will remain in lock. Therefore, $v_1$ is now controlled with respect to $v_0$ to obtain a desired difference frequency.

Similarly, right laser subsystem 124 includes laser 150, whose characteristics are similar to that of center laser 120 but provides a different signal $v_2$, for example, one that is +9 GHz greater in frequency than $v_0$, which is launchable into PM fiber link 134c and has a horizontal polarization. However, to control the stability of the microwave frequency difference, $v_0-v_2$, right laser subsystem 124 similarly includes equipment which is used to make sure that frequency $v_2$ maintains a constant relationship to the frequency $v_0$. As discussed similarly above with regard to $v_1$ and $v_0$, in practicing the present invention, there is no particular concern if the frequency $v_0$ of center laser 120 varies slightly, but that the difference between $v_2$ and $v_0$ is maintained.

Referring again back to center laser 120, laser light $v_0$ feeds into coupler/splitter node 126. At the splitter the other 10% of the $v_0$ power is diverted to PM fiber link 134e which outputs from coupler/splitter node 126 with a 45° polarization. At coupler/splitter node 126 the left side output onto PM fiber link 134d and the right side output polarization onto PM fiber link 134e are both 45°. At 50% coupler/splitter node 127 the left side output onto PM fiber link 134h and the right side output polarization onto PM fiber link 134m are both horizontal. The 10% light on fiber link 134e and the 50% feed into line 134m from coupler splitter node 127 partially combine in a fiber optic 50:50 coupler/splitter at node 130. Since the polarization states travelling along fiber links 134e and 134m are not the same, namely, one being 45° polarized and the other horizontally polarized, respectively, they likewise partially mix. The output from coupler/splitter node 130, as indicated by mixing arrows 162, falls upon photodiode 154 in right laser subsystem 124 from PM fiber link 134i, where the difference frequency generated by photodiode 154 is fed into RF mixer 156. The RF mixer is such that it is compatible with the frequency range being measured, for example, as in left subsystem 122, Anaren RF mixer product model no. 73230. The difference frequency is compared with a reference frequency, i.e., the desired difference frequency, from very stable synthesized oscillator 158 set at the desired frequency and the desired frequency is compared with the frequency generated in photodiode 154. The output of RF mixer 156 is coupled to laser offset locking accessory (LOLA) 152, for example, as in left subsystem 122, Lightwave Technology product model No. LOLA 2000 or 2005. LOLA 152, which, in turn, is coupled to laser 150, allows for agile temperature tuning and for piezoelectric tuning of its coupled laser's frequency. As such, right subsystem 124 likewise provides a phase lock loop, wherein the RF mixer produces the difference frequency between the reference and the actual difference frequency between the two light sources, lasers 120 and 150. If the difference frequency is non-zero, then a time varying function is output from the RF mixer and will cause a time varying variation in the frequency of $v_2$, which is being controlled by the LOLA 152. In essence, when the frequency difference between the reference and the actual frequency being generated is zero, but of the appropriate phase, then there is derived a steady-state voltage of the proper value so that the frequency of laser 150 is locked. It then follows that if small changes in the $v_0$ frequency from laser 120 are made, it will remain in lock. Therefore, $v_2$ is now controlled with respect to $v_0$ to obtain a desired difference frequency.

Referring back to coupler/splitter node 128, the remaining 50% of the optical power mix of $v_0$ and v1, flows through PM fiber link 134g, as indicated by mixing arrows 164, and is input into 50:50 coupler/splitter node 132. Similarly, referring back to coupler/splitter node 127, the remaining 50% of the optical power, horizontally polarized, flows through PM fiber line 134h and is input into coupler/splitter node 132. At coupler/splitter node 132 there is another 50:50 coupler/splitter.

At the right hand port of coupler/splitter node 132 there is output some $v_2$ (horizontal polarization), some $v_0$ (45° polarization), and some $v_1$ (vertical polarization). Some $v_0$ polarization will mix with $v_1$ and some $v_0$ polarization will mix with $v_2$. On the other hand, $v_1$ and $v_2$ again will not mix. The $v_0$ mixing with $v_1$ and the $v_0$ mixing with $v_2$ are represented by mixing direction arrows 168.

At coupler/splitter node 180 with ballast laser 182, the ballast laser/splitter arrangement allows the amount of microwave frequency producing light to be varied while maintaining a constant total optical power. This will occur if the total power in fiber 180 equals the total power in 168 since the splitter simply controls the 180/168 split, while the total amount of light is constant. Further, it should be noted that node 32 in FIG. 1 could be configured as node 180 in FIG. 5, if needed.

An optional portion of output from coupler/splitter node 180 along fiber link 134j can be monitored as desired by a reference photodiode 170, which, in turn, can be switched to for test comparison references measurements by RF Spectrum Analyzer 14.

Therefore, in accordance with the present invention there is provided a system which processes three different frequencies of light (i.e., three colors of light) such that when mixed together in such away they will interfere so that only two RF frequencies will be generated when this resultant light falls on a photodiode. The present invention provides a control of the polarization of the three frequencies in such a way that only the desired two RF frequencies will result, and furthermore, the total optical power may be constant while the power in the microwave frequencies is varied.

Those skilled in the art can appreciate that variations in various aspects of the present invention can be implemented in the embodiments described herein. For example, instead of using PM fiber links, freely propagating optical beams can be used.

While the embodiments of the present invention have been described in the context of a frequency generator for use in testing performance characteristics of photodiodes, those skilled in the art can appreciate that the frequency generator of the present invention can have other applications.

For example, the frequency generator of the present invention can be used in systems applications requiring discrete frequency signal generation for local oscillator (LO) distribution or for phased array antenna transmissions. These systems require the generation and delivery of very "clean" microwave signals, i.e., signals without unwanted harmonic mixing products. As such, the frequency generators described above can be readily used as a microwave signal source for such LO distribution and antenna transmissions.

What is claimed is:

1. A method of microwave frequency signal generation comprising the steps of:
   providing an incident reference signal;
   providing a first stimulus signal, the first stimulus signal having a first polarization and having a first predetermined relationship with the incident reference signal;
   providing a second stimulus signal, the second stimulus signal having a second polarization and having a second predetermined relationship with the incident reference signal;
   splitting the incident reference signal into a first polarization reference signal and into a second polarization reference signal;
   coupling the first stimulus signal with the first polarization reference signal to provide first polarization mixed signals;
   coupling the second stimulus signal with the second polarization reference signal to provide second polarization mixed signals; and
   combining the first polarization mixed signals with the second polarization mixed signals to provide output signals having only:
      a first component signal at the first predetermined relationship with the incident reference signal, and
      a second component signal at the second predetermined relationship with the incident reference signal.

2. The method of microwave frequency signal generation of claim 1, wherein the first predetermined relationship with the incident reference signal is provided by a first phase lock loop and the second predetermined relationship with the incident reference signal is provided by a second phase lock loop.

3. The method of microwave frequency signal generation of claim 2, wherein the first phase lock loop:
   couples a portion of the first stimulus signal and a portion of the first polarization reference signal to provide a first phase lock loop difference signal;
   compares the first phase lock loop difference signal with a first predetermined difference reference signal to provide a first difference correction signal; and
   tunes the first stimulus signal by the first difference correction signal to maintain the first predetermined relationship with the incident reference signal.

4. The method of microwave frequency signal generation of claim 2, wherein the second phase lock loop:
   couples a portion of the second stimulus signal and a portion of the second polarization reference signal to provide a second phase lock loop difference signal;
   compares the second phase lock loop difference signal with a second predetermined difference reference signal to provide a second difference correction signal; and
   tunes the second stimulus signal by the second difference correction signal to maintain the second predetermined relationship with the incident reference signal.

5. The method of microwave frequency signal generation of claim 1, wherein the first polarization is horizontal and the second polarization is vertical.

6. A method of microwave frequency signal generation comprising the steps of:
   providing an incident reference signal;
   providing a first stimulus signal, the first stimulus signal having a first polarization and having a first predetermined relationship with the incident reference signal;
   providing a second stimulus signal, the second stimulus signal having a second polarization and having a second predetermined relationship with the incident reference signal;
   splitting the incident reference signal into a first reference signal and into a second reference signal;
   coupling the first stimulus signal with the first reference signal to provide first polarization mixed signals; and
   combining the first polarization mixed signals with the second stimulus signal to provide output signals having only:
      a first component signal at the first predetermined relationship with the incident reference signal, and
      a second component signal at the second predetermined relationship with the incident reference signal.

7. The method of microwave frequency signal generation of claim 6, wherein the first predetermined relationship with the incident reference signal is provided by a first phase lock loop and the second predetermined relationship with the incident reference signal is provided by a second phase lock loop.

8. The method of microwave frequency signal generation of claim 7, wherein the first phase lock loop:
   couples a portion of the first stimulus signal and a portion of the first reference signal to provide a first phase lock loop difference signal;
   compares the first phase lock loop difference signal with a first predetermined difference reference signal to provide a first difference correction signal; and
   tunes the first stimulus signal by the first difference correction signal to maintain the first predetermined relationship with the incident reference signal.

9. The method of microwave frequency signal generation of claim 7, wherein the second phase lock loop:
   couples a portion of the second stimulus signal and a portion of the second reference signal to provide a second phase lock loop difference signal;
   compares the second phase lock loop difference signal with a second predetermined difference reference signal to provide a second difference correction signal; and
   tunes the second stimulus signal by the second difference correction signal to maintain the second predetermined relationship with the incident reference signal.

10. The method of microwave frequency signal generation of claim 6, wherein:
   the first polarization is horizontal;
   the second polarization is vertical; and
   the incident reference signal, the first reference signal, and the second reference signal are each at 45° polarization.

11. A microwave frequency signal generation system comprising:
   a reference source for providing an incident reference signal;
   a first source for providing a first stimulus signal, the first stimulus signal having a first polarization and having a first predetermined relationship with an incident reference signal generated by the first source;
   a second source for providing a second stimulus signal having a second polarization and having a second predetermined relationship with the incident reference signal;
   a first splitter coupled to the reference source for receiving and splitting the incident reference signal into a first polarization reference signal and into a second polarization reference signal;
   a second splitter coupled to the first splitter for coupling the first stimulus signal with the first polarization reference signal to provide first polarization mixed signals;
   a third splitter coupled to the first splitter for coupling the second stimulus signal with the second polarization reference signal to provide second polarization mixed signals; and
   a fourth splitter coupled to the second splitter and to the third splitter for combining the first polarization mixed frequency signals with the second polarization mixed frequency signals to provide output signals having only:
      a first component signal at the first predetermined relationship with the incident reference signal, and
      a second component signal at the second predetermined relationship with the incident reference signal.

12. The microwave frequency signal generation system of claim 11, wherein the first predetermined relationship with the incident reference signal is provided by a first phase lock loop coupled between the second splitter and the first source and the second predetermined relationship with the incident reference signal is provided by a second phase lock loop coupled between the third splitter and the second source.

13. The microwave frequency signal generation system of claim 12, wherein the first phase lock loop includes:
   a first phase lock loop photodiode for coupling a portion of the first stimulus signal and a portion of the first polarization reference signal to provide a first phase lock loop difference signal;
   a first phase lock loop mixer subsystem for comparing the first phase lock loop difference signal with a first predetermined difference reference signal to provide a first difference correction signal; and
   a first phase lock loop tuner coupled to the first phase lock loop mixer subsystem for tuning the first stimulus signal generated by the first source in response to the first difference correction signal to maintain the first predetermined relationship with the incident reference signal.

14. The microwave frequency signal generation system of claim 12, wherein the second phase lock loop includes:
   a second phase lock loop photodiode for coupling a portion of the second stimulus signal and a portion of the second polarization reference signal to provide a second phase lock loop difference signal;
   a second phase lock loop mixer subsystem for comparing the second phase lock loop difference signal with a second predetermined difference reference signal to provide a second difference correction signal; and
   a second phase lock loop tuner coupled to the second phase lock loop mixer subsystem for tuning the second stimulus signal generated by the second source in response to the second difference correction signal to maintain the second predetermined relationship with the incident reference signal.

15. The microwave frequency signal generation system of claim 11, wherein the first polarization is horizontal and the second polarization is vertical.

16. A microwave frequency signal generation system comprising:
   a reference source for providing an incident reference signal;
   a first source for providing a first stimulus signal, the first stimulus signal having a first polarization and having a first predetermined relationship with the incident reference signal;
   a second source for providing a second stimulus signal, the second stimulus signal having a second polarization and having a second predetermined relationship with the incident reference signal;
   a first splitter for receiving and splitting the incident reference signal into a first reference signal and into a second reference signal;
   a second splitter coupled to the first splitter for coupling the first stimulus signal with the first reference signal to provide first polarization mixed signals;
   a third splitter coupled to the first splitter and to the second source for combining the first polarization mixed signals with the second stimulus signal to provide output signals having a first component signal at the first predetermined relationship with the incident reference signal and a second component signal at the second predetermined relationship with the incident reference signal.

17. The microwave frequency signal generation system of claim 16, wherein the first predetermined relationship with the incident reference signal is provided by a first phase lock loop coupled between the second splitter and the first source and the second predetermined relationship with the incident reference signal is provided by a second phase lock loop coupled between the reference source and the second source.

18. The microwave frequency signal generation system of claim 17, wherein the first phase lock loop includes:
   a first phase lock loop photodiode for coupling a portion of the first stimulus signal and a portion of the first reference signal to provide a first phase lock loop difference signal;
   a first phase lock loop mixer subsystem for comparing the first phase lock loop difference signal with a first predetermined difference reference signal to provide a first difference correction signal; and
   a first phase lock loop tuner coupled to the first phase lock loop mixer subsystem for tuning the first stimulus signal in response to the first difference correction signal to maintain the first predetermined relationship with the incident reference signal.

19. The microwave signal generation system of claim 17, wherein the second phase lock loop includes:

a second phase lock loop diode for coupling a portion of the second stimulus signal and a portion of the second reference signal to provide a second phase lock loop difference signal;

a second phase lock loop mixer subsystem for comparing the second phase lock loop difference signal with a second predetermined difference reference signal to provide a second difference correction signal; and a second phase lock loop tuner for tuning the second stimulus signal in response to the second difference correction signal to maintain the second predetermined relationship with the incident reference signal.

20. The microwave frequency signal generation system of claim 16, wherein:

the first polarization is horizontal;

the second polarization is vertical; and the incident reference signal, the first reference signal, and the second reference signal are each at 45° polarization.

* * * * *